(12) United States Patent
Shoulders

(10) Patent No.: US 7,256,585 B1
(45) Date of Patent: Aug. 14, 2007

(54) MATCH-CORRECTED POWER MEASUREMENTS WITH A VECTOR NETWORK ANALYZER

(75) Inventor: Robert E. Shoulders, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/459,298

(22) Filed: Jul. 21, 2006

(51) Int. Cl.
*G01R 35/00* (2006.01)
*G01R 27/04* (2006.01)

(52) U.S. Cl. ..................... 324/601; 324/638
(58) Field of Classification Search ............... 324/600, 324/601, 638, 646, 650
See application file for complete search history.

(56) References Cited

U.S. PATENT DOCUMENTS

| | | | |
|---|---|---|---|
| 7,034,548 B2* | 4/2006 | Anderson | 324/600 |
| 7,061,254 B1* | 6/2006 | Shoulders et al. | 324/601 |
| 7,064,555 B2* | 6/2006 | Jamneala et al. | 324/601 |
| 7,107,170 B2* | 9/2006 | Jamneala et al. | 702/107 |

OTHER PUBLICATIONS

Roger B. Marks, "Formulations of the Basic Vector Network Analyzer Error Model including Switch Terms," 50th ARFTG Conference Digest, Dec. 1997, pp. 115-126.

* cited by examiner

*Primary Examiner*—Vincent Q. Nguyen
*Assistant Examiner*—Hoai-An D. Nguyen

(57) ABSTRACT

A network analysis system and methods facilitate a match-corrected signal power measurement using a vector network analyzer (VNA). The network analysis system includes the VNA and a computer program stored in memory and executed by a controller. The computer program has instructions that implement one or both of calibrating a test port of the VNA to determine the match-corrected signal power measurement and correcting a power measured for a signal received at the test port of the VNA using corrected error terms of a port calibration of the test port to yield a corrected measured power. The corrected error terms are determined from error terms of the port calibration using a switch term and an incident power calibration, both of the test port. A method 100 determines the match-corrected signal power measurement and a method 300 calibrates the VNA test port to determine the measurement.

23 Claims, 5 Drawing Sheets

MATCH-CORRECTED POWER MEASUREMENTS WITH A VECTOR NETWORK ANALYZER

CROSS-REFERENCE TO RELATED APPLICATIONS

N/A

STATEMENT REGARDING FEDERALLY SPONSORED RESEARCH OR DEVELOPMENT

N/A

BACKGROUND

Signal power measurement is a commonly performed test in radio frequency (RF) test and measurement. A variety of measurement systems provide some form of power measurement including, but not limited to, power meters, spectrum analyzers, scalar network analyzers, and vector network analyzers. Power meters are generally considered a preferred measurement tool for performing precise and accurate power measurements. A vector network analyzer (VNA) can also provide accurate power measurements of a signal emitted by a device under test (DUT) provided the VNA is properly calibrated. In particular, error coefficients from a full two-port calibration of the VNA may be used to compute a correction of raw power measurements taken using the VNA to yield accurate power measurements. See for example, Shoulders et al., U.S. Pat. No. 7,061,254, incorporated herein by reference.

However, in some situations a full two-port calibration is either difficult to perform or is not needed for other reasons and therefore is not performed. For example, when making waveguide mixer scalar conversion gain measurements, performing a full two-port calibration of a VNA can be problematic due to the frequency conversion inherent in the operation of the mixer. In other situations, a full two-port calibration of the VNA (or multiport calibration of a multiport VNA) is simply too complicated to be practical. In such situations where a full two-port or full multiport calibration is not desirable or is simply not performed, the accuracy of the VNA-based power measurement will suffer from a presence of systematic errors associated with the measurement process.

BRIEF SUMMARY

In some embodiments of the present invention, a method of determining a match-corrected power measurement of a signal using a vector network analyzer (VNA) is provided. The method of determining comprises correcting a power measured for a signal received at a test port of the vector network analyzer using corrected error terms of a port calibration of the test port to yield a corrected measured power. According to the method of determining, the corrected error terms are functions of both a switch term associated with the test port and an incident power calibration of the test port. The corrected measured power represents the match-corrected signal power measurement.

In other embodiments, a method of calibrating a test port of a vector network analyzer (VNA) to determine a match-corrected signal power measurement is provided. The method of calibrating comprises determining corrected error terms from error terms of a port calibration of the test port using a switch term associated with the test port and results of an incident power calibration of the test port. The corrected error terms facilitate determining the match-corrected signal power measurement at the calibrated test port.

In other embodiments, a network analysis system is provided. The network analysis system comprises a vector network analyzer (VNA) having a test port, a controller in communication with the VNA, a memory, and a computer program stored in the memory and executed by the controller. The computer program comprises instructions that, when executed by the controller, implement one or both of calibrating the test port of the VNA to determine a match-corrected signal power measurement and correcting a power measured for a signal received at the test port of the VNA using corrected error terms of a port calibration of the test port to yield a corrected measured power. The corrected error terms are determined from error terms of the port calibration using a switch term associated with the test port and an incident power calibration of the test port. The corrected measured power represents the match-corrected signal power measurement.

Certain embodiments of the present invention have other features that are one or both of in addition to and in lieu of the features described above. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
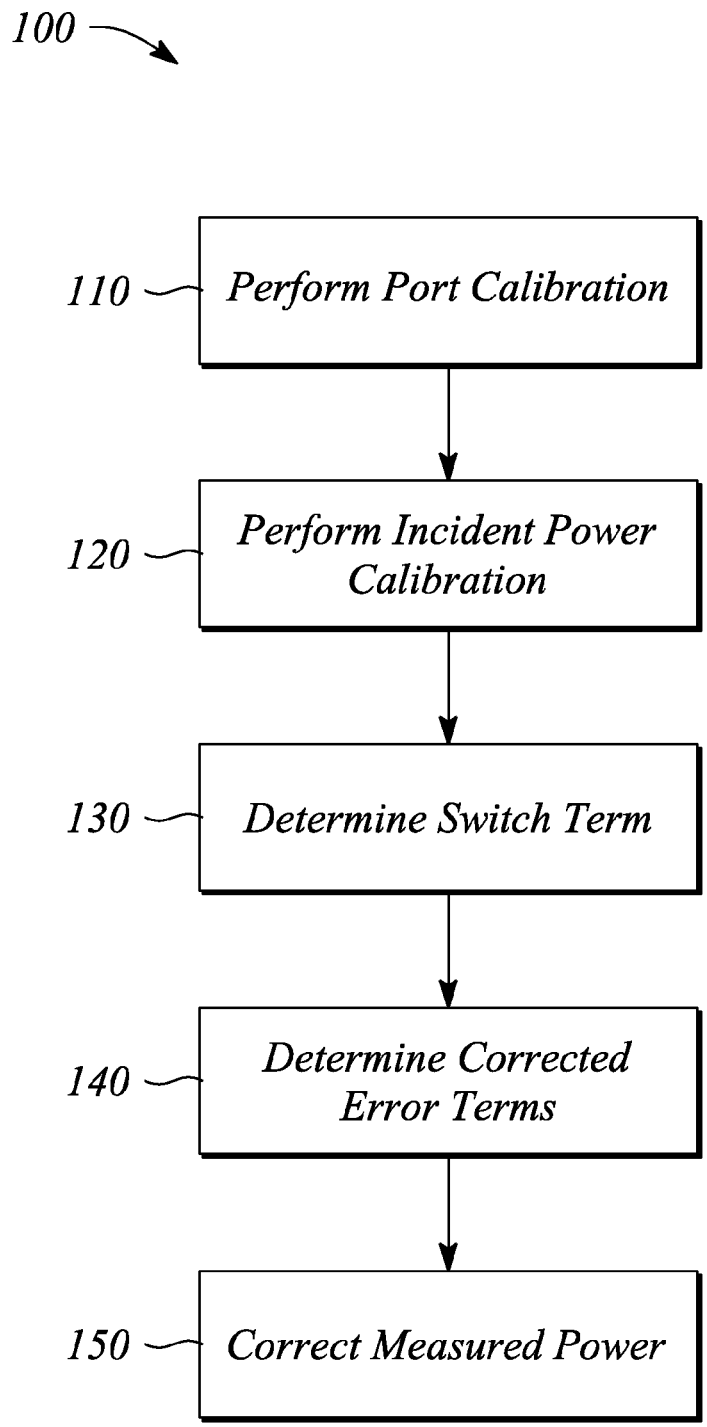
FIG. 1 illustrates a flow chart of a method of determining a match-corrected power measurement using a vector network analyzer (VNA) according to an embodiment of the present invention.

The embodiments of the present invention facilitate measuring signal power using a vector network analyzer (VNA). In particular, according to the various embodiments of the present invention, a match-corrected power measurement of a signal received by the VNA at a measurement or test port (e.g., Port-1) is determined. The received signal for which the match-corrected power measurement is determined may be generated by a device under test (DUT) or another source, for example. The match-corrected power measurement represents a power that would be delivered to an essentially 'perfect' test port.

As used herein, a 'perfect' test port is a test port of a VNA that presents a matched load to the received signal or to its source. In addition, the 'perfect' test port has no loss and exhibits no leakage or crosstalk between measurement arms or ports of a reflectometer used in conjunction with the test port. Since a VNA that provides a 'perfect' test port is yet to be constructed, all VNA test ports exhibit various systematic errors (e.g., input/output mismatch, leakage, crosstalk, etc.) that degrade an accuracy of a measurement produced by the VNA. According to various embodiments of the present invention, test port systematic errors associated with a power measurement using the VNA can be identified, quantified, and essentially removed from an uncorrected or 'raw' power measurement of a signal to yield or determine a match-corrected power measurement. As such, the determined match-correct power measurement facilitates performing accurate measurements of signal power emitted by a device under test (DUT), for example.

In some embodiments, the determination of a match-corrected power measurement employs a power measurement calibration of the VNA prior to using the VNA to measure the signal power. In such embodiments, the power measurement calibration is based on a conventional one port S-parameter calibration of the VNA. However, the conventional one-port calibration fails to account for all of the test port systematic errors associated with a power measurement using the VNA. The power measurement calibration embodiment of the present invention modifies or corrects error terms of the conventional one port S-parameter calibration. Specifically, a forward source match error term and a scalar or magnitude of a reverse power tracking error term are corrected, according to the embodiments of the present invention. In some embodiments, the corrected error terms from the power measurement calibration are subsequently employed along with a signal source reflection coefficient to correct a raw power measurement in determining the match-corrected power measurement.

In some embodiments, the corrected error terms are determined from the one-port calibration error terms in conjunction with additional measurements. In some embodiments, the additional measurements include measurements involving a single connection of a power sensor to the VNA and measurements involving a single connection to some device capable of providing an incident signal to the VNA port during an incident power calibration. The corrected error terms determined from the one port S-parameter calibration error terms along with information from the incident power calibration and the determined switch term of the power measurement calibration enable all of the pertinent systematic errors associated with the VNA test port to be essentially removed from the signal power measurement. In particular, the correction of the two error terms of the one-port calibration essentially accounts for those power measurement-related systematic errors not properly accounted for in the uncorrected error terms of the conventional one-port calibration. A measurement of signal power after power measurement calibration according to embodiments of the present invention is referred to herein as a 'calibrated' or 'match-corrected' power measurement.

FIG. 1 illustrates a flow chart of a method 100 of determining a match-corrected power measurement using a vector network analyzer (VNA) according to an embodiment of the present invention. The VNA is essentially any vector network analyzer including, but not limited to, a one port VNA, a two port VNA, a multi-port VNA, and a one port or a two-port VNA in combination with a test set that expands a number of measurement or test ports to more than two ports. The method 100 of determining essentially applies a correction to a 'raw' power measurement taken by the VNA to produce the match-corrected power measurement, wherein the correction accounts for various systematic errors associated with the VNA-based power measurement.

The method 100 of determining employs a single one of the test ports of the VNA to measure a signal power of a signal received by the test port (i.e., a received signal). The method 100 of determining operates on the 'raw' power measurement of the received signal taken by the VNA test port to determine or produce the match-corrected measurement. In some embodiments, the received signal is produced by a device under test (DUT).

A designation of which VNA test port is employed to measure signal power using the method 100 is entirely arbitrary. For example, for a multiport VNA, the test port employed may be a first test port designated 'Port-1', a second test port designated 'Port-2', or a third test port designated 'Port-3', and so on. In some embodiments, more than one of the test ports of the VNA is employed to perform power measurements on more than one received signal, according to the method 100. For example, a first test port (e.g., Port-1) may be employed to perform a power measurement on a first received signal while a third test port (e.g., Port-3) may be used to make a power measurement on a second received signal. Again, a relationship between the test port employed and the received signal for which power is measured using the test port is entirely arbitrary. Herein, for discussion purposes only and not by way of limitation, it is assumed herein that any one of Port-1, Port-2, Port-3, etc. is employed to measure the signal power of the received signal.

The method 100 of determining comprises performing 110 a one-port calibration of a test port (e.g., Port-1) of the VNA. Hereinafter, the test port being calibrated is also referred to as Port-1 by way of example and not by way of limitation. Also, herein "port calibration" means and is used interchangeably with "one-port calibration" unless otherwise specifically indicated. In some embodiments, the one-port calibration is a one-port S-parameter calibration performed on the VNA. In some embodiments, the one-port S-parameter calibration is a conventional one-port calibration of the VNA. For example, the one-port calibration may comprise measuring a reflection response of several calibration standards using Port-1 of the VNA. An exemplary one-port calibration employs measurements of a set of calibrations standards including a short circuit standard (Short), an open circuit standard (Open), and a load standard (Load). In some embodiments, the port calibration may be a native one-port S-parameter calibration of the VNA. For discussion purposes only and not by way of limitation, performing 110 a one-port calibration of a test port of the VNA will be described herein in terms of performing 110 the one-port S-parameter calibration.

All one-port S-parameter calibration methodologies for VNA calibration essentially determine error coefficients or error terms of a virtual one-port error adaptor. The one-port error adaptor models an effect that systematic error sources associated with the test port have on measurements made using the test port. Once determined, the error terms provide a mechanism for correcting measurements performed by the VNA at the calibrated test port. Specifically, the determined error terms are employed to transform raw measurements into calibrated measurements from which the modeled effects of the systematic errors represented by the error terms have been removed. Commercially available VNAs generally provide one or more native or built-in one-port S-parameter calibration routines.

Figure 2A:
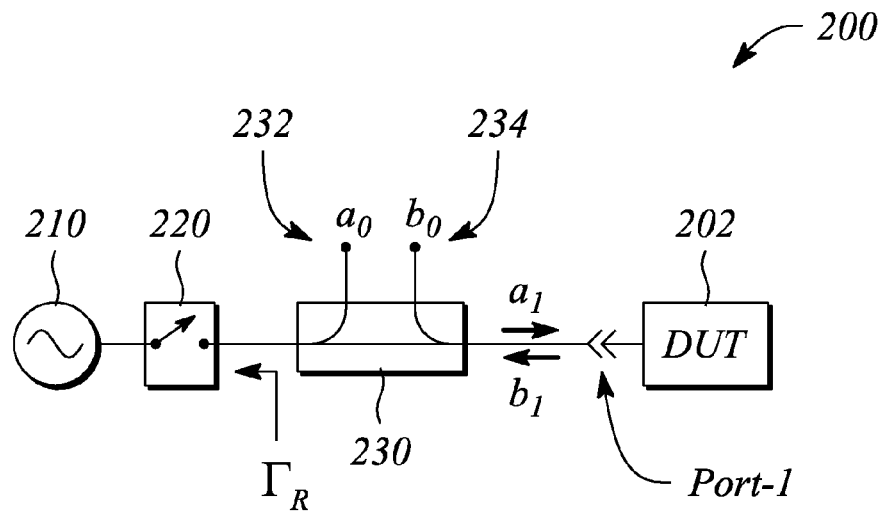
FIG. 2A illustrates a block diagram of an exemplary measurement channel of a vector network analyzer (VNA) according to an embodiment of the present invention.

FIG. 2A illustrates a block diagram of an exemplary measurement channel 200 of a vector network analyzer (VNA) according to an embodiment of the present invention. The measurement channel 200 is associated with a test port (e.g., Port-1) of the VNA. Herein, for discussion purposes only, the test port and the measurement channel 200 associated therewith are referred to interchangeably unless an explicit distinction is necessary.

As illustrated in FIG. 2A, the measurement channel 200 is connected to a device under test (DUT) 202 at the test port Port-1. One skilled in the art will recognize that the exemplary measurement channel 200 illustrated in FIG. 2A is a simplified representation of a conventional measurement channel of a VNA. The simplified representation illustrated in FIG. 2A is being used for discussion purposes only and is not intended to limit the scope of the present invention.

The exemplary measurement channel 200, as illustrated in FIG. 2A, comprises a signal source 210, a source switch 220, and a bi-directional reflectometer 230. An output of the signal source 210 is connected to an input of the source switch 220. An output of the source switch 220 is connected to an input of the bi-directional reflectometer 230. An output of the bi-directional reflectometer 230 is connected to the test port Port-1. The signal source 210 is a stimulation source of the VNA, the signal source 210 being used as an excitation source to test the DUT 202.

The source switch 220 is represented by a single-pole-single-throw (SPST) switch for simplicity of discussion only and not by way of limitation. When the source switch 220 is ON or in a 'closed' position, an excitation signal from the signal source 210 is communicated to the DUT 202. The measurement channel 200 is in a 'source mode' when the source switch 220 is ON. When the source switch 220 is OFF or in an 'open' position, the excitation signal is blocked and not communicated to the DUT 202. When the source switch 220 is OFF, the measurement channel 200 is in a 'receive mode'.

The bi-directional reflectometer 230 is represented in FIG. 2A as a pair of back-to-back directional couplers. A first coupler samples an incident wave or signal $a_0$ traveling from the source switch 220 toward the test port Port-1 and outputs the sample signal $a_0$ at a first reference arm or port 232. A second coupler of the bi-directional reflectometer 230 samples a scattered wave or signal $b_0$ traveling from the test port Port-1 toward the source switch 220 and outputs the sample signal $b_0$ for measurement by the VNA at a second reference arm or port 234. Note that since the signal samples $a_0$, $b_0$ essentially represent the traveling waves $a_0$, $b_0$ to which they correspond, no distinction need be made between the samples and the actual waves for the purpose of discussion herein.

Figure 2B:
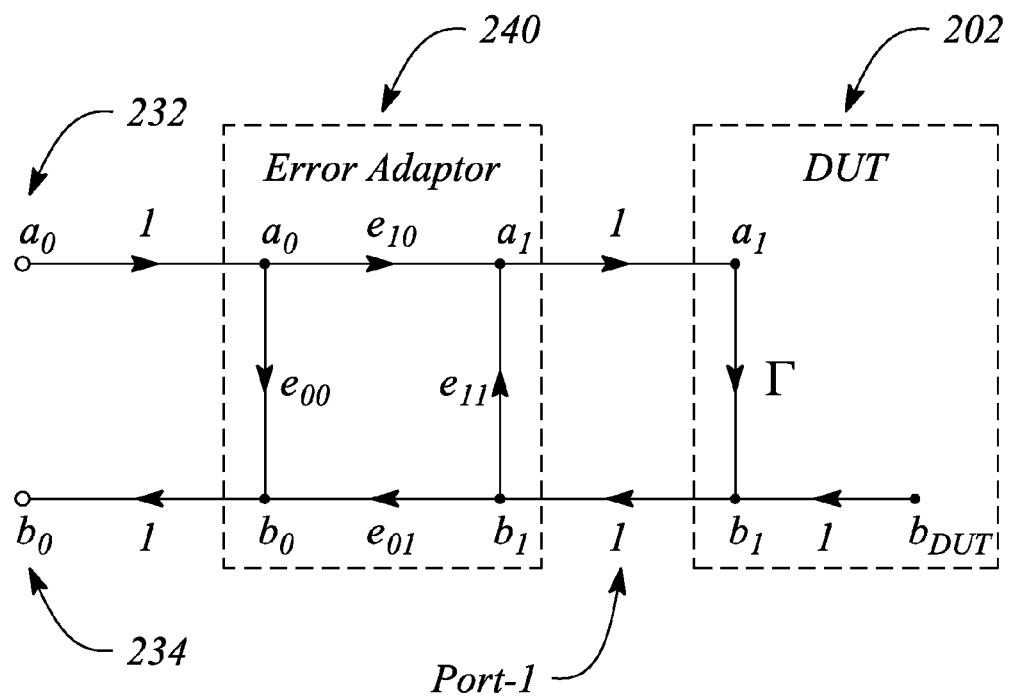
FIG. 2B illustrates an exemplary signal flow graph of the measurement channel illustrated in FIG. 2A according to an embodiment of the present invention.

FIG. 2B illustrates an exemplary signal flow graph of the measurement channel 200 illustrated in FIG. 2A. The signal flow graph illustrated in FIG. 2B essentially maps the corrected incident and scattered signals $a_1$, $b_1$ to the respective uncorrected or 'raw' incident and scattered signals $a_0$, $b_0$. Also illustrated in the signal flow graph of FIG. 2B is a reflection coefficient or term $\Gamma$ associated with a reflection at a port of the DUT 202 connected at the test port Port-1 of the VNA. The corrected incident and scattered signals $a_1$, $b_1$ are illustrated inside a portion of the signal flow graph labeled 'DUT' that is associated with the DUT 202. Also illustrated in the signal flow graph of FIG. 2B is a node $b_{DUT}$ within the DUT portion that represents an actual signal produced by a signal source within the DUT 202.

By convention, nodes (i.e., dots) of the signal flow graph represent signals and vertices (i.e., arrows connecting the nodes) represent relationships between the signals. A portion of the signal flow graph that is associated with a virtual one-port error adaptor 240 is labeled 'Error Adaptor' in FIG. 2B. The Error Adaptor portion of the signal flow graph comprises vertices that represent error coefficients or error terms, wherein the error terms serve to define the virtual one-port error adaptor 240.

The virtual one-port error adaptor 240 transforms or corrects 'raw' or uncorrected measurements of the incident and scattered signals $a_0$, $b_0$ to remove systematic errors associated with the measurement channel 200 and thus, produces corrected measurements. The corrected measurements can be viewed as measurements of essentially 'error free' incident and scattered signals $a_1$, $b_1$. In essence, the virtual error adaptor 240 transforms the 'raw' incident and scattered signals $a_0$, $b_0$, into the error free incident and scattered signals $a_1$, $b_1$.

As illustrated in FIG. 2B, the error terms associated with the virtual one-port error adaptor 240 include a forward directivity error term $e_{00}$, a forward source match error term $e_{11}$, and a forward reflection tracking error term $e_{10}e_{01}$. The forward reflection tracking error term $e_{10}e_{01}$ is a product of a forward tracking error term $e_{10}$ and a reverse or reflection tracking error term $e_{01}$. During performing 110 the one-port S-parameter calibration, three independent measurements of a set of calibration standards (e.g., Short, Open, Load) facilitate unambiguously determining the three error terms $e_{00}$, $e_{11}$, and $e_{10}e_{01}$. As such, performing 110 the one-port S-parameter calibration essentially determines the virtual one-port error adaptor 240, according to some embodiments.

In general, the one-port S-parameter calibration does not allow the forward tracking error term $e_{10}$ and the reflection tracking error term $e_{01}$ to be separately determined. As such, separation of the forward tracking error term $e_{10}$ and the reflection tracking error term $e_{01}$ is typically unnecessary in a conventional one-port S-parameter calibration of the VNA, and a product term (i.e., forward reflection tracking error term $e_{10}e_{01}$) is employed directly for error correction. However, according to various embodiments of the present, separating the forward tracking error term $e_{10}$ and the reflection tracking error term $e_{01}$ is allowed and useful when determining a match-corrected power measurement. According to the method 100, such a separation of the forward tracking error term $e_{10}$ and the reflection tracking error term $e_{01}$ is provided, as described below.

Referring again to FIG. 1, the method 100 of determining a match-corrected power measurement further comprises performing 120 an incident power calibration of the VNA test port. The incident power calibration determines a scalar forward power tracking error term $|e_{10}|$. The scalar forward power tracking error term $|e_{10}|$ is essentially a magnitude of the forward tracking error term $e_{10}$. In some embodiments, the scalar forward power tracking error term $|e_{10}|$ is determined from a measured output or source power $P_{inc(cal)}$ of the VNA (also known as 'incident power') and an input match or reflection coefficient $\Gamma_{pm}$ of a device used to measure the output power $P_{inc(cal)}$.

In some embodiments, during performing 120 an incident power calibration, the output power $P_{inc(cal)}$ of the VNA may be measured using a device, such as a power meter. The power meter is connected to the Port-1 with the VNA set to act as a signal source for an output power $P_{inc(cal)}$ measurement. A selection of the device for the output power $P_{inc(cal)}$ measurement is based on a frequency range of interest. For example, the frequency range of interest may be an operational range of frequencies of a particular DUT for which a match-corrected power measurement ultimately is to be made by the VNA according to the method 100 of determining. Then the VNA is employed to measure the input match or reflection coefficient $\Gamma_{pm}$ of the device (e.g., the power meter) while connected to the Port-1 of the VNA, which is the test port on which the one-port calibration was performed 110. For discussion purposes only and not by way of limitation, a power meter will be the device used to perform the output power $P_{inc(cal)}$ measurement of the VNA.

Figure 3:
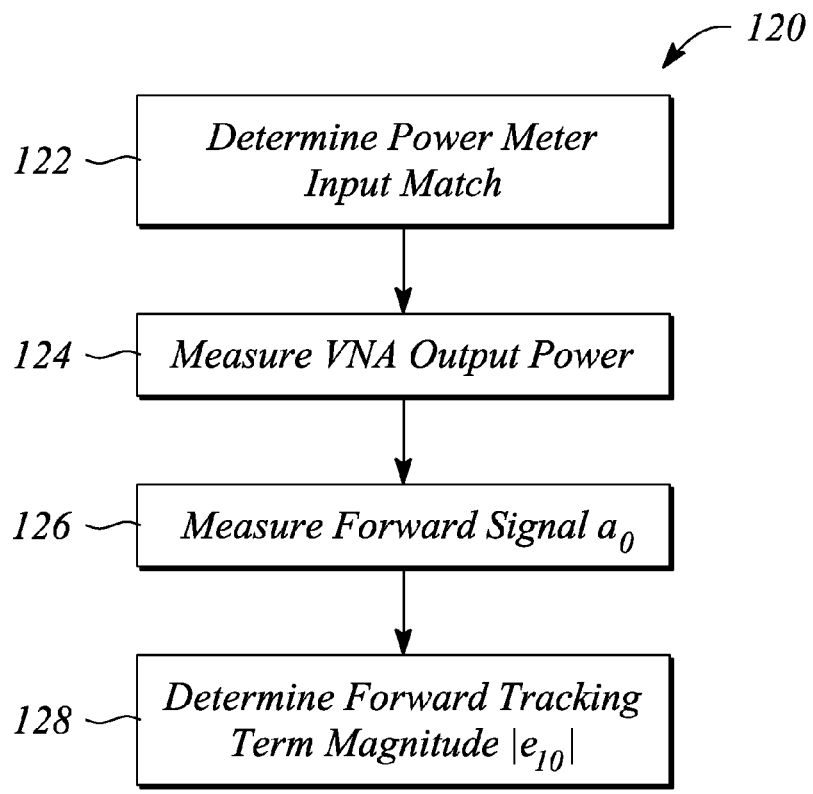
FIG. 3 illustrates a flow chart of performing an incident power calibration illustrated in FIG. 1 according to an embodiment of the present invention.

FIG. 3 illustrates a flow chart of performing 120 an incident power calibration, according to an embodiment of the present invention. In some embodiments, prior to performing 120 an incident power calibration, the output or source power $P_{inc(cal)}$ of the VNA is set to an arbitrary fixed level. In general, the VNA source power $P_{inc(cal)}$ is set to a level that is within a measurement range of the power meter. In some embodiments, the source power $P_{inc(cal)}$ is set at a level that is near a point in the measurement range that provides a highest accuracy of source power measurement provided by or according to specifications of the power meter. Most commercially available VNAs have means for adjusting and controlling source power $P_{inc(cal)}$. If the means for adjusting the power is not provided by the VNA, a native source power level of the VNA is employed and a power meter that accommodates the native source power level is selected and used.

Performing 120 an incident power calibration comprises determining 122 an input match $\Gamma_{pm}$ of the power meter. Herein, the term 'input match' is used interchangeably with, and has the same meaning as, 'input reflection coefficient'. Essentially, for a power meter that employs a power sensor to measure power, the input match $\Gamma_{pm}$ is an input reflection coefficient of the power sensor employed by the power meter. In some embodiments, determining 122 the input match $\Gamma_{pm}$ comprises connecting the power meter to the Port-1 of the VNA, which was used in performing 110 a one-port calibration, as described above. Determining 122 the input match $\Gamma_{pm}$ further comprises performing a calibrated reflection measurement of the connected power meter using the VNA. The calibrated reflection measurement employs the previously performed 110 one-port S-parameter calibration to correct a raw reflection measurement and produce the calibrated reflection measurement. The calibrated reflection measurement produces the determined or measured 122 input match $\Gamma_{pm}$ for the connected power meter. In other embodiments, the input match $\Gamma_{pm}$ is determined 122 using another calibrated vector network analyzer. In yet other embodiments, the input match $\Gamma_{pm}$ is provided by a manufacturer of the power meter or even another source (e.g., a metrology service) and is within the scope of determining 122 the input match $\Gamma_{pm}$.

Performing 120 an incident power calibration further comprises measuring 124 the output power $P_{inc(cal)}$ of the VNA using the power meter. Essentially, the power meter measures 124 the VNA output power $P_{inc(cal)}$ according to a normal operation of the power meter. The measured 124 output power $P_{inc(cal)}$ is referred to herein also as the incident power $P_{inc(cal)}$ since it represents a power level incident on the power meter.

Performing 120 an incident power calibration further comprises measuring 126 an incident signal $a_{0(cal)}$ in a reference arm of a measurement portion of the VNA. The incident signal $a_{0(cal)}$ is measured 126 concomitant with the power meter measuring 124 the incident power $P_{inc(cal)}$. Specifically, the incident signal $a_{0(cal)}$ is sampled within the measurement portion (i.e., reference arm) of the VNA and the sample or a value (e.g. a complex number) representing the sample is recorded by the VNA (e.g., stored in memory of the VNA). In some embodiments, only a magnitude of the incident signal $|a_{0(cal)}|$ is measured 126. In other embodiments, only a power of the incident signal $|a_{0(cal)}|^2$ is measured 126.

Performing 120 an incident power calibration further comprises determining 128 a magnitude of the forward tracking error term $e_{10}$, referred to as a 'scalar forward tracking error term' $|e_{10}|$ herein. In some embodiments, the scalar forward tracking error term $|e_{10}|$ is determined 128 using equation (1):

$$|e_{10}| = \sqrt{P_{inc(cal)}} \cdot \frac{|1 - e_{11}\Gamma_{PM}|}{|a_{0(cal)}|} \qquad (1)$$

where the forward source match error term $e_{11}$ is determined above during performing 110 a one-port S-parameter calibration. The resulting scalar forward tracking error term $|e_{10}|$ represents an output of performing 120 an incident power calibration.

When the method 100 of determining involves a frequency range of interest, performing 120 is repeated at each frequency within the frequency range of interest. Similarly, the one-port S-parameter calibration or port calibration is performed 110 at each frequency within the frequency range of interest. A frequency range of interest is employed when measuring an output power of a DUT that produces a wideband output or that produces an output signal at more than one frequency, for example. Interpolation may be employed between frequencies within the frequency range of interest.

Referring back to FIG. 1, the method 100 of determining further comprises determining 130 a switch term $\Gamma_R$ of the VNA at the Port-1 test port. The switch term $\Gamma_R$ is determined 130 with the VNA in the receive mode. The switch term $\Gamma_R$ essentially accounts for any differences in an internal reflection performance of the VNA between the source mode and the receive mode. The switch term $\Gamma_R$ is represented by a reflection term associated with a source switch in the VNA (e.g., source switch 220) when the source switch is OFF. The switch term $\Gamma_R$ is known in the art. For example, a thorough discussion of the switch term $\Gamma_R$ for a VNA is provided by Roger B. Marks, 'Formulations of the Basic Vector Network Analyzer Error Model including Switch Terms,' 50$^{th}$ ARFTG Conference Digest, December 1997, pp. 115-126, incorporated herein by reference.

Figure 4:
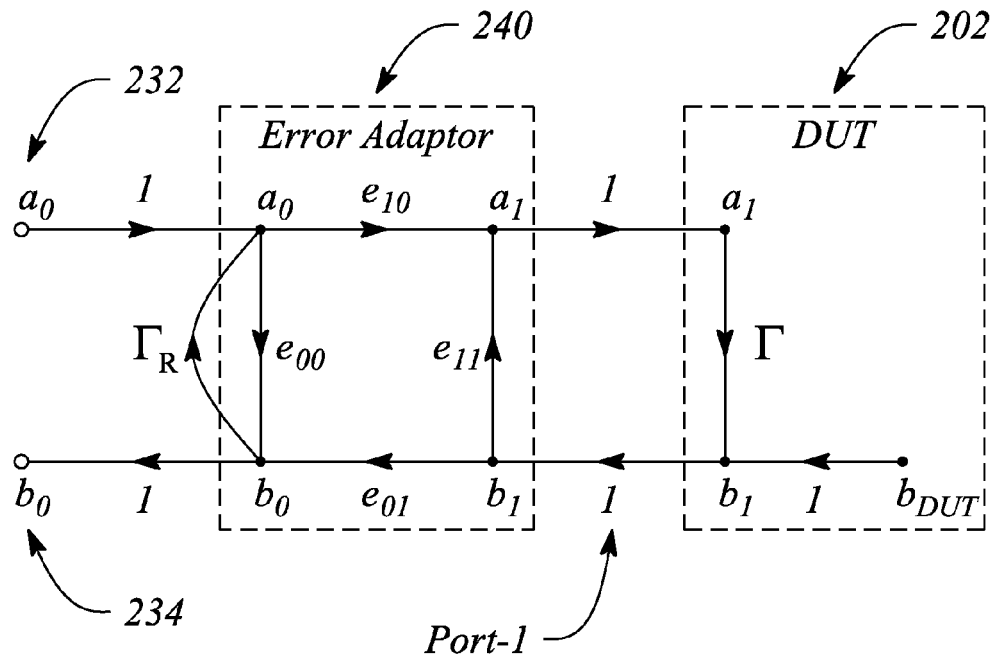
FIG. 4 illustrates a signal flow graph of the exemplary measurement channel illustrated in FIG. 2A according to another embodiment of the present invention.

FIG. 4 illustrates a signal flow graph of the exemplary measurement channel illustrated in FIG. 2A according to another embodiment of the present invention, wherein the switch term $\Gamma_R$ is included. The signal flow graph illustrated in FIG. 4 is essentially similar to the signal flow graph illustrated in FIG. 2B in as much as similarly labeled portions, e.g., vertices and nodes in FIGS. 4 and 2B, represent equivalent respective portions, quantities or signals. As illustrated in FIG. 4, the signal flow graph further includes the switch term $\Gamma_R$ represented as a vertex '$\Gamma_R$' connecting nodes $a_0$, $b_0$.

In some embodiments, determining 130 a switch term $\Gamma_R$ comprises taking a ratio of a measurement of the incident signal $a_0$ to a measurement of the scattered signal $b_0$ (i.e., $\Gamma_R=a_0/b_0$) when a signal (described below) is applied to the Port-1 with the VNA set in receive mode. For example, according to some embodiments, the VNA is set to receive mode by setting the source switch 220 to OFF, as described above. A signal is applied (i.e., 'applied signal') to the Port-1 of the VNA, and the incident and scattered signals $a_0$, $b_0$ are measured. The switch term $\Gamma_R$ is then computed as a ratio of the measured incident signal $a_0$ and the measured scattered signal $b_0$. Specifically, the switch term $\Gamma_R$ equals the measured incident signal $a_0$ divided by the measured scattered signal $b_0$. Referring to the exemplary measurement channel 200 illustrated in FIG. 2A, the samples of the incident signals $a_0$, $b_0$ appearing at the respective reference arms 232, 234 of the bi-directional reflectometer 230 may be measured and the ratio computed therefrom, for example.

In some embodiments, the applied signal is provided by a DUT (e.g., the DUT 202 illustrated in FIG. 2A). Alternatively, the applied signal may be provided by another signal source (e.g., a signal generator or synthesizer). A power level of the applied signal need not be known since determining 130 a switch term $\Gamma_R$ involves a relative measure of the applied signal (e.g., the ratio $a_0/b_0$). Thus, the signal source for the applied signal may be essentially any signal source. In some embodiments, the signal source produces an applied signal that is at least similar in frequency to that associated with or expected from a prospective DUT.

In some embodiments, the switch term $\Gamma_R$ is determined 130 by a user of the VNA when employing the method 100. In other embodiments, the switch term $\Gamma_R$ is measured or otherwise established and then subsequently provided to the user of the VNA. For example, a manufacturer of the VNA may include the switch term $\Gamma_R$ stored in a memory of the VNA. In another example, the switch term $\Gamma_R$ may be provided in a printed or electronic manual or similar documentation for the VNA or a system comprising the VNA. In yet another example, another user may determine 130 the switch term $\Gamma_R$ and subsequently provide the switch term $\Gamma_R$ to the user. In such embodiments, determining 130 comprises accessing the provided switch term $\Gamma_R$. In other embodiments, the switch term $\Gamma_R$ may be known a priori. For example, the switch term $\Gamma_R$ may be evident from knowledge of an operation of the VNA. In another example, the switch term $\Gamma_R$ may be known a priori from a model of the VNA. In yet another example, a priori knowledge of the switch term $\Gamma_R$ may be from another VNA or an unidentified source. In such embodiments, determining 130 comprises employing the a priori known switch term $\Gamma_R$.

Referring again to FIG. 1, the method 100 of determining further comprises determining 140 corrected error terms $e'_{11}$, $|e'_{01}|$. Specifically, determining 140 comprises computing a first corrected error term $e'_{11}$ from the error terms $e_{11}$, $e_{01}e_{10}$, $e_{00}$ using the determined 130 switch term $\Gamma_R$. In some embodiments, the first corrected error term $e'_{11}$ is given by equation (2):

$$e'_{11} = e_{11} + \left(\frac{e_{01}e_{10} \cdot \Gamma_R}{(1 - e_{00} \cdot \Gamma_R)}\right) \quad (2)$$

where the error terms $e_{11}$, $e_{01}e_{10}$, $e_{00}$ are those determined in performing 110 a one port S-parameter calibration, described above. In some embodiments, the first corrected error term $e'_{11}$ represents the forward source match error term $e_{11}$ corrected to account for the switch term $\Gamma_R$.

Determining 140 corrected error terms further comprises computing a second corrected error term $|e'_{01}|$ from the error terms $e_{01}e_{10}$, $e_{00}$ using the determined 130 switch term $\Gamma_R$ along with the scalar forward tracking error term $|e_{10}|$ from the performed 120 incident power calibration. In some embodiments, the second corrected error term $|e'_{01}|$ is given by equation (3):

$$|e'_{01}| = \frac{|e_{01}e_{10}|}{(|e_{10}| \cdot |1 - e_{00} \cdot \Gamma_R|)} \quad (3)$$

where the error terms $e_{01}e_{10}$, $e_{00}$ are those determined in performing 110 a one-port calibration. The second corrected error term $|e'_{01}|$ is a scalar term. In some embodiments, the second corrected error term $|e'_{01}|$ is a corrected magnitude (i.e., scalar) of the reverse or reflection tracking error term $e_{01}$.

The method 100 of determining further comprises correcting 150 a measured power of a received signal from a DUT (e.g., the DUT 202), wherein the received signal is measured at the calibrated test port Port-1 using the VNA. Correcting 150 a measured power applies a correction to a raw or uncorrected power $P_{RAW}$ measured for the received signal from the DUT to produce a corrected power $P_{Z0}$. The correction to the raw power $P_{RAW}$ employs the determined 140 corrected error terms $e'_{11}$, $|e'_{01}|$.

In some embodiments, correcting 150 a measured power comprises measuring the raw power $P_{RAW}$ at the calibrated test port, Port-1 of the VNA. The measured raw power $P_{RAW}$ is essentially equal to a magnitude squared of a measurement of the scattered signal $b_0$ (i.e., $P_{RAW}=|b_0|^2$) when the VNA is in the receive mode and the DUT is acting as a signal source.

For example, consider the exemplary measurement channel 200 of FIG. 2A. The raw measured power $P_{RAW}$ is measured by setting the source switch 220 to OFF and connecting the DUT 202 to the calibrated Port-1. The DUT 202 then provides a signal to the Port-1 that is measured at the bi-directional reflectometer 230. The raw power $P_{RAW}$ is then computed by squaring the magnitude of the measurement of the scattered signal $b_0$ at reference arm 234.

Correcting 150 a measured power further comprises determining a reflection coefficient $\Gamma$ of the DUT connected to the calibrated Port-1 of the VNA. In some embodiments, the reflection coefficient $\Gamma$ is determined comprising performing a calibrated reflection measurement of the DUT using the VNA. The calibrated reflection measurement employs the port calibration performed 110 for the Port-1. In other embodiments, determining the reflection coefficient $\Gamma$ of the DUT comprises measuring the DUT using another reflection measurement system (e.g., another calibrated VNA) or from data provided by a manufacturer of the DUT.

Correcting 150 a measured power further comprises determining the corrected power $P_{Z0}$ using the determined

140 corrected error terms e'$_{11}$, |e'$_{01}$|. The corrected power P$_{z0}$ may be determined according to equation (4):

$$P_{Z0} = |1 - e'_{11} \cdot \Gamma|^2 \cdot \frac{|b_0|^2}{|e'_{01}|^2} \quad (4)$$

where the reflection coefficient Γ was determined for the DUT connected to the calibrated Port-1. The corrected power P$_{Z0}$ represents a power that would be delivered by the DUT to a matched load of impedance Z$_0$.

Figure 5:
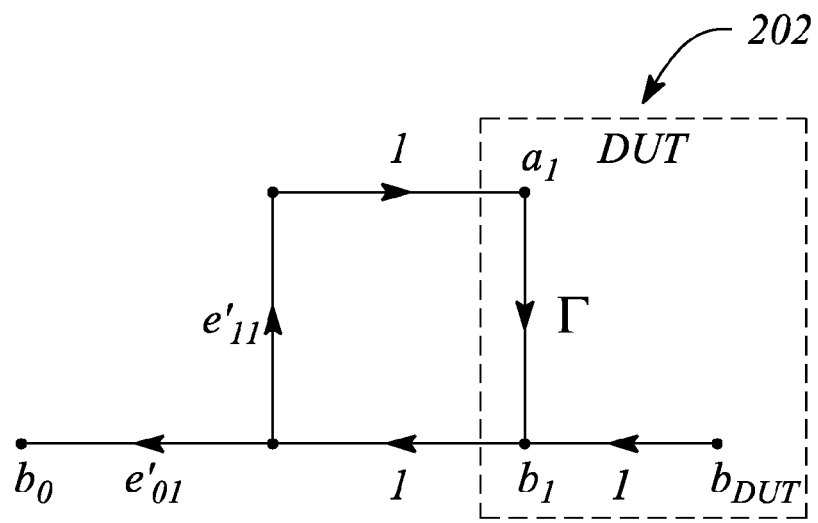
FIG. 5 illustrates a signal flow graph depicting a relationship between a DUT signal $b_{DUT}$ and a scattered signal $b_0$ within a vector network analyzer (VNA) according to an embodiment of the present invention.

The correction represented by equation (4) is derived from a relationship between the signal produced by the DUT and the signal as measured by the VNA. FIG. 5 illustrates a signal flow graph depicting a relationship between the DUT 202 signal b$_{DUT}$ and a scattered signal b$_0$ within the VNA. Corrected error terms e'$_{11}$, |e'$_{01}$| and the reflection coefficient Γ of the DUT 202 relate the two signal b$_0$, b$_{DUT}$ to each other in the illustrated signal flow graph. The relationship is given by equation (5):

$$b_0 = \frac{b_{DUT} \cdot e'_{01}}{(1 - e'_{11} \cdot \Gamma)} \quad (5)$$

Equation (5) can be solved for the DUT signal b$_{DUT}$. However, equation (5) depends on a corrected error term e'$_{01}$, which is not generally available. Fortunately, since the method 100 of determining a match-corrected power measurement is intended to measure the power of the DUT signal b$_{DUT}$ (i.e., |b$_{DUT}$|$^2$), only the second corrected error term |e'$_{01}$| (i.e., scalar term) is needed. This leads directly to equation (4) above.

Figure 6:
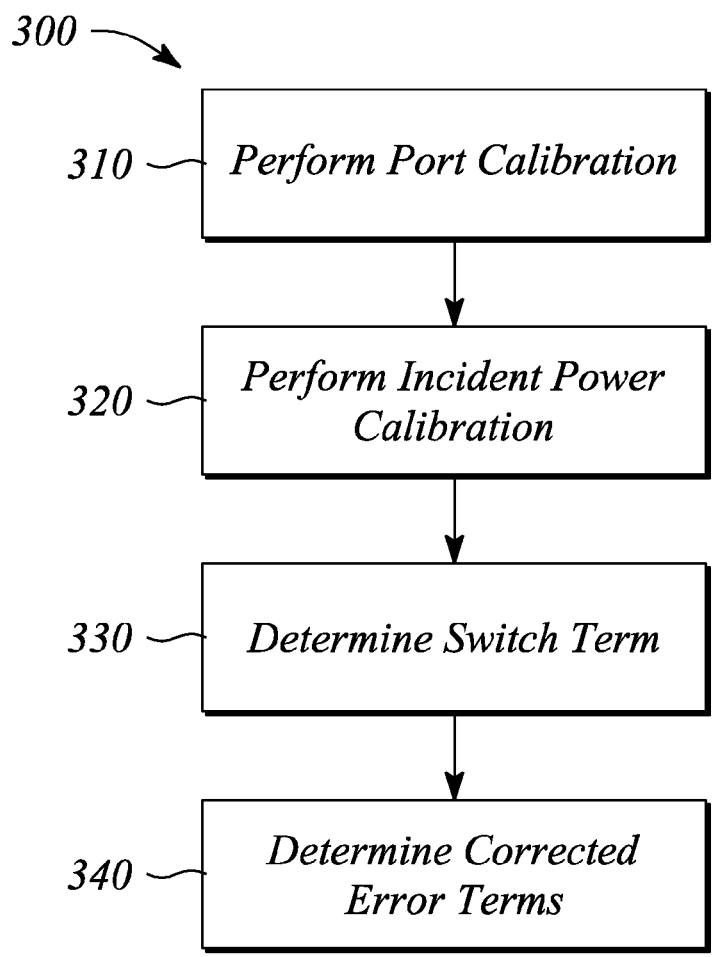
FIG. 6 illustrates a flow chart of a method of calibrating a test port of a vector network analyzer (VNA) to determine a match-corrected signal power measurement according to an embodiment of the present invention.

FIG. 6 illustrates a flow chart of a method 300 of calibrating a vector network analyzer (VNA) to determine a match-corrected signal power measurement according to an embodiment of the present invention. The method 300 of calibrating a VNA comprises performing 310 a port calibration of a test port of the VNA. In some embodiments, performing 310 a port calibration is essentially similar to performing 110 a port calibration described above with respect to the method 100 of determining a match-corrected power measurement. In particular, performing 310 a port calibration establishes at least a one-port calibration of the VNA at the test port.

The method 300 of calibrating a VNA further comprises performing 320 an incident power calibration at the test port. In some embodiments, performing 320 an incident power calibration is essentially similar to performing 120 an incident power calibration described above with respect to the method 100 of determining. In particular, performing 320 an incident power calibration determines a scalar forward tracking error term |e$_{10}$| associated with the test port. In some embodiments, performing 320 an incident power calibration employs equation (1).

The method 300 of calibrating further comprises determining 330 a switch term Γ$_R$ of the VNA at the test port. In particular, the switch term Γ$_R$ is determined 330 with the VNA in the receive mode for the test port. In some embodiments, the switch term Γ$_R$ is determined 330 by measuring the incident and scattered signals a$_0$, b$_0$ when a signal is applied to the test port with the VNA in receive mode. The switch term Γ$_R$ is then determined 330 by computing a ratio of the measured signals (i.e., Γ$_R$=a$_0$/b$_0$). In some embodiments, determining 330 a switch term Γ$_R$ is essentially similar to determining 130 a switch term Γ$_R$ described above with respect to the method 100 of determining a match-corrected power measurement.

The method 300 of calibrating further comprises determining 340 corrected error terms e'$_{11}$, |e'$_{01}$|. In some embodiments, the corrected error terms e'$_{11}$, |e'$_{01}$| are determined 330 using equation (2) and equation (3) above. In particular, the corrected error terms e'$_{11}$, |e'$_{01}$| are determined 340 from the results of the performed 310 port calibration (e.g., error terms e$_{11}$, e$_{01}$e$_{10}$, e$_{00}$) and the determined 330 switch term Γ$_R$. In some embodiments, determining 340 corrected error terms e'$_{11}$, |e'$_{01}$| is essentially similar to determining 140 corrected error terms e'$_{11}$, |e'$_{01}$| described above with respect to the method 100 of determining a match-corrected power measurement.

Once the corrected error terms e'$_{11}$, |e'$_{01}$| are determined 340, they may be employed in place of equivalent error terms e$_{11}$, |e$_{01}$| in measuring and computing a calibrated power measurement of a signal received by the test port of the VNA. In other words, once the corrected error terms e'$_{11}$, |e'$_{01}$| are determined 340, the VNA or specifically, the test port, is said to be calibrated to measure a match-corrected signal power of a signal received from a DUT at the calibrated test port according to this embodiment of the present invention. For example, the VNA, which is calibrated according to the method 300 of calibrating, may employ equation (4) above to convert a measured signal power |b$_0$|$^2$ received from a DUT into a calibrated or match-corrected signal power P$_{Z0}$.

Figure 7A:
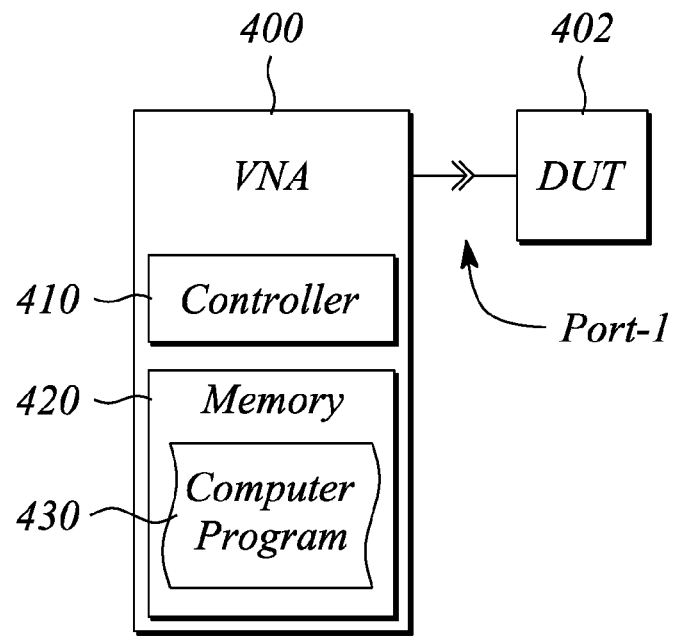
FIG. 7A illustrates a block diagram of a vector network analyzer (VNA) providing a match-corrected power measurement of a received signal according to an embodiment of the present invention.
Figure 7B:
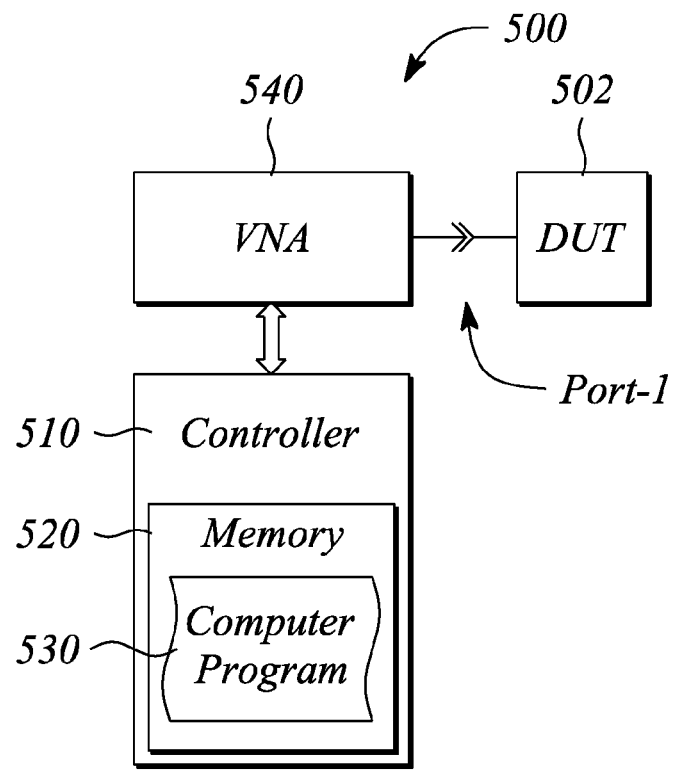
FIG. 7B illustrates a block diagram of a network analysis system providing a match-corrected signal power measurement according to another embodiment of the present invention.

FIG. 7A illustrates a block diagram of a vector network analyzer (VNA) 400 that provides a match-corrected signal power measurement according to an embodiment of the present invention. FIG. 7B illustrates a block diagram of a network analysis system 500 that provides a match-corrected power measurement of a received signal according to another embodiment of the present invention. In particular, the VNA 400 and the network analysis system 500 each determine a match-corrected power measurement of a signal received at a measurement port (e.g., Port-1). The signal may be generated by and received from a device under test (DUT) 402, 502, for example. The VNA 400 and the network analysis system 500 employ a test port calibration that corrects for a test port mismatch during measurement. Calibrating the VNA 400 and the network analysis system 500, according to the present invention, facilitates performing accurate measurements of signal power of a signal emitted by the DUT 402, 502.

The VNA 400 comprises a test port (e.g., Port-1) that may be connected to the DUT 402 when measuring a signal power of a signal received from the DUT 402, for example. In some embodiments, the VNA 400 has additional test ports (not illustrated). The VNA 400 of FIG. 7A further comprises a controller 410, a memory 420 and a computer program 430. In some embodiments, the controller 410 may be a microprocessor or central processing unit (CPU) of the VNA 400. The computer program 430 is stored in the memory 420 and is executed by the controller 410. In some embodiments, the VNA 400 is a commercially available VNA that includes and executes the computer program 430. Exemplary commercially available VNAs that may be used as VNA 400 include, but are not limited to, model E8362B PNA Network Analyzer, manufactured by Agilent Technologies, Inc., Palo Alto, Calif.

The network analysis system 500 illustrated in FIG. 7B comprises a controller or processor 510, a memory 520 and a computer program 530. The computer program 530 is stored in the memory 520 and is executed by the controller 510. The network analysis system 500 further comprises a vector network analyzer (VNA) 540 that is connected to communicate with at least the controller 510 via a data interface or bus. The VNA 540 comprises a test port (Port-1) that may be connected to the DUT 502, for example. In some embodiments, the VNA 540 is similar to the VNA 400. However, in contrast to the VNA 400, the VNA 540 is separate from the controller 510 and the memory 520 with the stored computer program 530. For example, the controller 510 may be a general purpose computer. In some embodiments, the controller 510 may be connected to the VNA 540 by way of a data transfer and control interface that enables the controller 510 to control an operation of the VNA 540 and to receive data therefrom. In some embodiments, the VNA 540 may further comprise a controller and memory (not illustrated). In such embodiments, the controller 510 may interact with the controller of the VNA 540 to implement control of and data transfer from the VNA 540.

The computer program 430, 530 comprises instructions that, when executed by the respective controller 410, 510, implement measuring match-corrected signal power of the DUT 402, 502. In particular, the instructions of the computer program 430, 530 implement performing a match-corrected power calibration of the VNA 400, 540. In such embodiments, the instructions that implement the match-corrected power calibration may essentially implement the method 300 of calibrating a VNA, as described above. In some embodiments, the instructions further implement correcting a measured power of a received signal from the DUT 402, 502 according to the match-corrected power calibration. In such embodiments, the instructions of the computer program 430, 530 may essentially implement the method 100 of determining a match-corrected power measurement, as described above.

In particular, in various embodiments, the instructions of the computer program 430, 530 implement performing a port calibration of the test port (Port-1) of the VNA 400, 540. The instructions that implement performing a port calibration may essentially implement performing 110, 310 a port calibration that is described above with respect to either of the methods 100 or 300, respectively. The instructions of the computer program 430, 530 further implement performing an incident power calibration at the test port of the VNA 400, 540. The instructions that implement performing an incident power calibration may essentially implement performing 120, 320 an incident power calibration that is described above with respect to either of the methods 100 or 300, respectively. The instructions of the computer program 430, 530 further implement both determining a switch term $\Gamma_R$ and determining corrected error terms $e'_{11}$, $|e'_{01}|$ of the VNA 400, 540. The instructions that implement determining a switch term $\Gamma_R$ may essentially implement determining 130, 330 a switch term $\Gamma_R$ according to either of the methods 100 or 300, respectively. The instructions that implement determining corrected error terms $e'_{11}$, $|e'_{01}|$ may essentially implement determining 140, 340 corrected error terms $e'_{11}$, $|e'_{01}|$, as respectively described above for either of the method 100 or the method 300. In some embodiments, the instructions further implement correcting a measured power of a received signal from the DUT 402, 502. In some of these embodiments, the instructions essentially implement correcting 150 a measured power, which is described above with respect to the method 100.

Thus, there have been described various embodiments of a method of calibrating a VNA for a match-corrected signal power measurement and a method of determining a match-corrected signal power measurement using a VNA. Also described were various embodiments of a VNA and a network analysis system implementing match-corrected signal power measurement calibration or match-corrected power measurement determination of a signal from a DUT, wherein the measurement determination includes the calibration. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A method of determining a match-corrected power measurement of a signal using a vector network analyzer, the method comprising:

correcting a power measured for a signal received at a test port of the vector network analyzer using corrected error terms of a port calibration of the test port to yield a corrected measured power, wherein the corrected error terms are functions of both a switch term associated with the test port and an incident power calibration of the test port, the corrected measured power representing the match-corrected signal power measurement, the switch term being a reflection coefficient of a port termination when the vector network analyzer is in receive mode.

2. The method of determining of claim 1, wherein correcting a power comprises determining the corrected measured power from a measured power according to $$P_{Z0} = |1 - e'_{11} \cdot \Gamma|^2 \cdot \frac{|b_0|^2}{|e'_{01}|^2}$$

where a term $P_{Z0}$ is the corrected measured power, a term $|b_0|^2$ is the measured power produced by the vector network analyzer, a term $\Gamma$ is a reflection coefficient of a source of the signal, and terms $e'_{11}$ and $|e'_{01}|$ are the corrected error terms, the term $e'_{11}$ being a first corrected error term, and the term $|e'_{01}|$ being a second corrected error term.

3. The method of determining of claim 2, wherein the first corrected error term $e'_{11}$ is a function of error terms of the port calibration and a switch term $\Gamma_R$ of the test port according to $$e'_{11} = e_{11} + \left( \frac{e_{01}e_{10} \cdot \Gamma_R}{(1 - e_{00} \cdot \Gamma_R)} \right)$$

where terms $e_{11}$, $e_{00}$, $e_{01}e_{10}$ are the error terms of the port calibration, the term $e_{11}$ being a forward source match error term, the term $e_{00}$ being a forward directivity error term, and the term $e_{01}e_{10}$ being a forward reflection tracking error term.

4. The method of determining of claim 2, wherein the second corrected error term $|e'_{01}|$ is a function of error terms of the port calibration and a switch term $\Gamma_R$ of the test port according to $$|e'_{01}| = \frac{|e_{01}e_{10}|}{(|e_{10}| \cdot |1 - e_{00} \cdot \Gamma_R|)}$$

where a term $|e_{10}|$ is a scalar forward tracking error term, a term $e_{00}$ is a forward directivity error term, and a term $e_{01}e_{10}$ is a forward reflection tracking error term of the error terms of the port calibration.

5. The method of determining of claim 4, wherein the scalar forward tracking error term $|e_{10}|$ is determined from an incident power calibration of the test port according to $$|e_{10}| = \sqrt{P_{inc(cal)}} \cdot \frac{|1 - e_{11}\Gamma_{PM}|}{|a_{0(cal)}|}$$

where a term $P_{inc(cal)}$ is power measured for an incident signal produced by the vector network analyzer at the test port during the incident power calibration, a term $|a_{0(cal)}|$ is a magnitude of a signal level of the incident signal $a_{0(cal)}$, the signal level being measured at a reference arm of a reflectometer of the test port, and a term $\Gamma_{PM}$ is a reflection coefficient of a power sensor, the power sensor being used to measure the incident signal power $P_{inc(cal)}$ at the test port.

6. The method of determining of claim 1, further comprising:
performing the port calibration of the test port of the vector network analyzer, the port calibration providing error terms of a virtual error adaptor for the test port;
performing the incident power calibration of the test port;
determining the switch term of the vector network analyzer associated with the test port; and
determining the corrected error terms from the error terms of the performed port calibration and the performed incident power calibration,
wherein the corrected error terms comprise a first corrected error term and a second corrected error term.

7. The method of determining of claim 6, wherein performing the incident power calibration comprises:
determining an input match of a power meter at the test port;
measuring an output source power of the vector network analyzer at the test port, the vector network analyzer being set to act as a signal source;
measuring an incident signal in a reference arm of a measurement portion of the vector network analyzer; and
determining a forward tracking error term magnitude as a function of the measured incident signal, the measured output source power, the determined input match, and a forward source match error term of the port calibration.

8. The method of determining of claim 6, wherein determining the switch term comprises:
applying a signal into the test port with the vector network analyzer set in a receive mode; and
measuring an incident signal and a scattered signal in a measurement portion of the vector network analyzer associated with the test port; and
wherein the switch term is a ratio of the measured incident signal to the measured scattered signal.

9. The method of determining of claim 6, wherein determining the corrected error terms comprises:
using the determined switch term to determine the first corrected error term from a forward source match error term, a forward reflection tracking error term and a forward directivity error term of the performed port calibration; and
using results from the performed incident power calibration at the test port to determine the second corrected error term from the forward reflection tracking error term and the forward directivity error term.

10. The method of determining of claim 1, further comprising measuring the power of the signal received at the test port, wherein measuring the power comprises:
connecting a device under test to the test port, the device under test producing the signal received at the test port;
measuring a reflection coefficient of the device under test; and
measuring a raw power of the received signal.

11. The method of determining of claim 1, wherein correcting a power comprises:
determining the corrected measured power using the corrected error terms, a reflection coefficient of a device under test connected to the test port and a measured raw power of the signal received at the test port, the received signal being generated by the device under test, wherein the corrected error terms comprise a first corrected error term and a second corrected error term.

12. The method of determining of claim 1 implemented by a network analysis system, the network analysis system comprising:
the vector network analyzer having the test port;
a controller in communication with the vector network analyzer;
a memory; and
a computer program stored in the memory and executed by the controller,
wherein instructions of the computer program, when executed by the controller, implement determining the match-corrected power measurement of a signal from a device under test connected to the test port of the vector network analyzer, the signal being received and measured at the test port.

13. A method of calibrating a test port of a vector network analyzer to determine a match-corrected signal power measurement, the method comprising:
determining corrected error terms from error terms of a port calibration of the test port using a switch term associated with the test port and results of an incident power calibration of the test port, wherein the corrected error terms facilitate determining the match-corrected signal power measurement at the calibrated test port and the switch term being a reflection coefficient of a port termination with the vector network analyzer in receive mode.

14. The method of calibrating of claim 13, further comprising:
performing the port calibration of the test port of the vector network analyzer, the port calibration providing the error terms;
performing the incident power calibration of the test port;
determining the switch term of the vector network analyzer associated with the test port.

15. The method of calibrating of claim 13, wherein the corrected error terms are determined comprising:
determining a first corrected error term $e'_{11}$ from the error terms of the port calibration and the switch term $\Gamma_R$ according to $$e'_{11} = e_{11} + \left(\frac{e_{01}e_{10} \cdot \Gamma_R}{(1 - e_{00} \cdot \Gamma_R)}\right)$$

where the term $e_{11}$ is a forward source match error term of the error terms of the port calibration and where terms $e_{00}$ and $e_{01}e_{10}$ are the error terms of the port calibration, the term $e_{00}$ being a forward directivity error term, and the term $e_{01}e_{10}$ being a forward reflection tracking error term; and determining a second corrected error term $|e'_{01}|$ from the error terms of the port calibration and the determined switch term $\Gamma_R$ of the test port according to $$|e'_{01}| = \frac{|e_{01}e_{10}|}{(|e_{10}| \cdot |1 - e_{00} \cdot \Gamma_R|)}$$

where a term $|e_{10}|$ is a scalar forward tracking error term computed from the results of the incident power calibration.

16. The method of calibrating of claim 15, wherein the scalar forward tracking error term $|e_{10}|$ is determined from results of the incident power calibration of the test port according to $$|e_{10}| = \sqrt{P_{inc(cal)}} \cdot \frac{|1 - e_{11}\Gamma_{PM}|}{|a_{0(cal)}|}$$

where a term $P_{inc(cal)}$ is power measured for an incident signal produced by the vector network analyzer at the test port during the incident power calibration, a term $|a_{0(cal)}|$ is a magnitude of a signal level of the incident signal $a_{0(cal)}$, the signal level being measured at a reference arm of a reflectometer of the test port, and a term $\Gamma_{PM}$ is a reflection coefficient of a power sensor, the power sensor being used to measure the incident signal power $P_{inc(cal)}$ at the test port.

17. The method of calibrating of claim 13 implemented by a network analysis system, the network analysis system comprising:
the vector network analyzer having the test port;
a controller in communication with the vector network analyzer;
a memory; and
a computer program stored in the memory and executed by the controller,
wherein instructions of the computer program, when executed by the controller, implement performing both the port calibration and the incident power calibration of the test port, and implement determining both the switch term and the corrected error terms, such that the test port is calibrated for the match-corrected signal power measurement by the vector network analyzer.

18. The method of calibrating of claim 17, wherein the instructions of the computer program further implement providing the match-corrected signal power measurement of a signal received by the calibrated test port, wherein providing the match-corrected measurement comprises correcting a measured power of the signal received at the calibrated test port using the determined corrected error terms, such that the corrected measured power is the match-corrected signal power measurement.

19. A network analysis system comprising:
a vector network analyzer having a test port;
a controller in communication with the vector network analyzer,
a memory; and
a computer program stored in the memory and executed by the controller,
wherein instructions of the computer program, when executed by the controller, implement one or both of calibrating the test port of the vector network analyzer to determine a match-corrected signal power measurement and correcting a power measured for a signal received at the test port of the vector network analyzer using corrected error terms of a port calibration of the test port to yield a corrected measured power,
wherein the corrected error terms are determined from error terms of the port calibration using a switch term associated with the test port and an incident power calibration of the test port, the corrected measured power representing the match-corrected signal power measurement, the switch term being a reflection coefficient of a port termination when the vector network analyzer is in receive mode.

20. The network analysis system of claim 19, wherein the instructions of the computer program that implement calibrating the test port of the vector network analyzer to determine the match-corrected power measurement comprise instructions that implement:
performing the port calibration of the test port of the vector network analyzer, the performed port calibration providing error terms of a virtual error adaptor for the test port;
performing the incident power calibration of the test port;
determining the switch term of the vector network analyzer associated with the test port; and
determining the corrected error terms from the error terms of the port calibration using the determined switch term and results from the performed incident power calibration,
wherein the corrected error terms are a first corrected error term and a second corrected error term.

21. The network analysis system of claim 19, wherein the instructions of the computer program that implement correcting a power measured for a signal received at the test port of the vector network analyzer comprise instructions that implement:
determining the corrected measured power from the measured power of the received signal according to $$P_{Z0} = |1 - e'_{11} \cdot \Gamma|^2 \cdot \frac{|b_0|^2}{|e'_{01}|^2}$$

where a term $P_{Z0}$ is the corrected measured power, a term $|b_0|^2$ is the measured power produced by the vector network analyzer, a term $\Gamma$ is a reflection coefficient of a source of the signal, and where terms $e'_{11}$ and $|e'_{01}|$ are the corrected error terms, the term $e'_{11}$ being the first corrected error term, and the term $|e'_{01}|$ being the second corrected error term.

22. The network analysis system of claim 19, wherein the instructions of the computer program that implement correcting a power measured for a signal received at the test port of the vector network analyzer comprise instructions that implement:
determining the first corrected error term $e'_{11}$ from the error terms of the port calibration and the switch term $\Gamma_R$ according to $$e'_{11} = e_{11} + \left(\frac{e_{01}e_{10} \cdot \Gamma_R}{(1 - e_{00} \cdot \Gamma_R)}\right)$$

where the term $e_{11}$ is a forward source match error term of the error terms of the port calibration and where terms $e_{00}$ and $e_{01}e_{10}$ are the error terms of the port calibration, the term $e_{00}$ being a forward directivity error term, and the term $e_{01}e_{10}$ being a forward reflection tracking error term; and
determining the second corrected error term $|e'_{01}|$ from the error terms of the port calibration and the determined switch term $\Gamma_R$ of the test port according to $$|e'_{01}| = \frac{|e_{01}e_{10}|}{(|e_{10}| \cdot |1 - e_{00} \cdot \Gamma_R|)}$$

where a term $|e_{10}|$ is a scalar forward tracking error term computed from the results of the incident power calibration.

23. The network analysis system of claim 19, wherein the vector network analyzer comprises the controller, the memory and the computer program.

\* \* \* \* \*

UNITED STATES PATENT AND TRADEMARK OFFICE
CERTIFICATE OF CORRECTION

PATENT NO. : 7,256,585 B1 Page 1 of 1
APPLICATION NO. : 11/459298
DATED : August 14, 2007
INVENTOR(S) : Shoulders It is certified that error appears in the above-identified patent and that said Letters Patent is hereby corrected as shown below:

In column 14, line 39, in Claim 2, delete "$|b^0|^2$" and insert -- $|b_0|^2$ --, therefor.

In column 18, line 46, in Claim 21, delete "$|b^0|^2$" and insert -- $|b_0|^2$ --, therefor.

Signed and Sealed this

Eleventh Day of December, 2007

JON W. DUDAS
*Director of the United States Patent and Trademark Office*